United States Patent [19]

Kumabe

[11] Patent Number: 4,983,541

[45] Date of Patent: Jan. 8, 1991

[54] SEMICONDUCTOR LASER DEVICE FABRICATION

[75] Inventor: Hisao Kumabe, Itami, Japan

[73] Assignee: Mitsubishi Denki Kabushiki Kaisha, Hyogo, Japan

[21] Appl. No.: 437,376

[22] Filed: Nov. 13, 1989

Related U.S. Application Data

[60] Division of Ser. No. 338,341, Apr. 13, 1989, Pat. No. 4,890,292, which is a continuation of Ser. No. 222,375, Jul. 19, 1988, abandoned, which is a continuation of Ser. No. 89,085, Aug. 25, 1987, abandoned.

[30] Foreign Application Priority Data

Sep. 2, 1986 [JP] Japan .................................. 61-207339

[51] Int. Cl.5 .......................................... H01L 29/205
[52] U.S. Cl. .................................................... 437/129
[58] Field of Search ...................... 437/129; 372/45, 48

[56] References Cited

U.S. PATENT DOCUMENTS

| | | | |
|---|---|---|---|
| 4,532,631 | 7/1985 | Shima | 372/48 |
| 4,630,279 | 12/1986 | Kajimura | 372/45 |
| 4,750,184 | 6/1988 | Kumabe | 372/45 |

FOREIGN PATENT DOCUMENTS 0197787 11/1983 Japan .................................. 372/48

Primary Examiner—Olik Chaudhuri
Assistant Examiner—Ken S. Kim
Attorney, Agent, or Firm—Nixon & Vanderhye

[57] ABSTRACT

Disclosed herein is a semiconductor laser device capable of exhibiting very low threshold current and operating in a fundamental transverse mode stably even at a high power operation, and a method for fabricating the same. The fabricating method includes only two crystal growth steps to thereby produce the semiconductor laser device capable of operating in the fundamental transverse mode at high power operation. The thus obtained device has high reproducability due to the simple fabricating process.

1 Claim, 2 Drawing Sheets

SEMICONDUCTOR LASER DEVICE FABRICATION

This is a division of application Ser. Nos. 07/338,341 filed Apr. 13, 1989, now Pat. No. 4,890,292, which is a continuation of application 07/222,375 filed July 19, 1988, now abandoned, which is a continuation of application Ser. No. 07/089,085 filed Aug. 25, 1987, now abandoned.

BACKGROUND OF THE INVENTION (1) Field of the Invention

This invention relates to a high power semiconductor laser device capable of operating stably in a fundamental transverse mode even at high temperature as a light source for use in an optical communication system, an optical information transmission system and the like, and a method for fabricating the same.

(2) Description of the Prior Art

FIGS. 1(a) and 1(b) are schematic diagrams illustrating, in cross-section, a front view and a side view of a conventional AlGaAs semiconductor laser device, respectively.

In such a semiconductor laser device as shown in FIGS. 1(a) and 1(b), an n-GaAs current blocking layer 22 is grown on a p-GaAs crystal substrate 21 for instance, by an opitaxial crystal growth method, and then a portion of the n-GaAs current blocking layer 22 is subjected to selective etching to form a V-shaped stripe groove 29 having a depth so that a part of the crystal substrate 21 is exposed at the bottom of such groove 29. After the first-step growth, a p-$Al_yGa_{1-y}As$ lower cladding layer 23, an $Al_xGa_{1-x}As$ active layer 24, an n-$Al_yGa_{1-y}As$ upper cladding layer 25 and an n-GaAs contact layer 26 are grown, in the stated order, on the n-GaAs current blocking layer 22 and the groove 29 by the second-step growth where $y > x$. Thereafter, a pair of n-side and p-side electrodes 27 and 28 are provided to both sides of the semiconductor, respectively. The laser device becomes operative when a forward bias voltage is applied across the n-side and p-side electrodes 27 and 28, and a forward direction current higher than a threshold level is caused to flow in the active layer 24.

With such a semiconductor laser device as described above, an electric current path is limitedly formed in the vicinity of the groove 29 by the formation of the current blocking layer 22 and the groove 29 to thereby concentrate the current in a partial active region of the active layer 24, which corresponds to the width of the groove 29. This structure is an example of inner current confinement structures.

Further, in addition to a double heterojunction in lateral direction, the semiconductor laser device has a loss-guide structure in the transverse direction, where an effective refractive index variation occurs at both sides of the groove 29. More specifically, in the loss-guide structure, the thickness of the lower cladding layer 23 is determined so as to be more thick at a portion corresponding to the width of the groove 29 and so as to be more thin at portions not corresponding to propagation path of a lasing beam, whereby light absorption is accomplished at the current blocking layer 22 whose forbidden band width is smaller than that of the active layer 24, and the width of the groove 29 (approximately corresponding to that of the effective active region) is made narrower to cut-off the higher operation mode. Therefore, it is possible to confine carriers and light in the active layer effectively. To this end, the above described semiconductor laser device is capable of operating with a relatively low threshold current level of 5 mW or less under CW condition at room temperature, having a smooth lasing beam radiation pattern and operating at high temperature in the fundamental transverse mode operation.

While there are almost no problems in the case where the conventional semiconductor laser device is used for producing a relatively low output power, the laser device is disadvantageous in that there may occur a variety of problems in the case where the device is used to produce a relatively high output power of 20 to 30 mW and more. These problems will be described hereinbelow.

As shown in FIG. 1(b), the active layer 24 is entirely uniform in size and in quality to both resonator end facets 30, and therefore the resonator end facets 30 where carriers are poor due to rapid surface recombination, acts as light absorption regions. As the output power of the device increases, the amount of absorption also increases resulting in an occurrence of runaway of a cycle of light absorption, heat generation and an increase in temperature at the resonator end facets 30. When the power exceeds a certain power density level (several $mW/Cm^2$ in AlGaAs laser device), COD (Catastrophic Optical Damage) may occur resulting in melting damage of the resonator end facets 30. This finally results in such a problem that the semiconductor laser device is out of order.

A variety of laser structures have been proposed in order to improve the output power limit. One example is NAM (Non-Absorbing Mirror) structure in which the forbidden band width of the resonator end facets 30 is made larger than that of the active layer 24 by way of selective diffusion of an impurity using a masking layer of SiN for instance or selective growth of a layer having a wide forbidden band width at the resonator end facets 30, so as to decrease the light absorption at the facets 30. In the NAM structure, the power density is improved nearly one order of magnitude or more by a conventional semiconductor laser device (to several tens of $mW/cm^2$), as a result of which high output power operation becomes possible. In this case, however it should be, noted that the NAM structure is disadvantageous since it requires an intricate fabricating process requiring a highly accurate control technique. Further, with the NAM structure, in the case of employing no guide means in the transverse direction to the facets 30, extremely large astigmatism may increase remarkably resulting in problems in practical use.

There is another problem in high output power operation that the oscillation mode may become unstable. It is considered that this problem is due to variations in refractive index distribution or current distribution in the active layer which may be caused by high power density or current density. More specifically the problem resides in an the occurrence of a kink (bending) in the light output power versus current characteristics, undesireded moving of a lasing output beam or the occurrence of plural peaks in a lasing beam radiation pattern.

In order to improve the above-described unstability in the oscillation mode, a variety of methods have been proposed. Concrete examples thereof are to employ either a bury-structure of the active region or an inner current confinement structure, or making the active layer 24 thinner. These methods have been used to make gain distribution (current distribution) and refractive index distribution uniform to thereby stabilize the oscillation mode. However, these methods have been disadvantage in that extremely high accuracy is required in the control technique, as a result of which the fabricating process becomes highly intricate and thus it is difficult to achieve high reproducability of a semiconductor laser device having preferred characteristics (particularly preferred characteristics in the high output power operation mode).

SUMMARY AND OBJECTS OF THE INVENTION

In view of the above-described difficulties accompanying the conventional semiconductor laser devices, a primary object of the present invention is to provide a semiconductor laser device having a low threshold current with low astigmatism and a single-peak and smooth radiation pattern, and further being capable of operating in high a output power operation mode stably at high temperature.

According to the present invention, the above and other objects of the present invention are met by providing a semiconductor laser device and a method for fabricating the same as follows.

The semiconductor laser device of the invention comprises: a first-conductivity type semiconductor crystal substrate having a U-shaped stripe groove formed in a resonator direction thereon; a first-conductivity type lower cladding layer formed on the grooved sustrate, the lower cladding layer being bent along the U-shaped stripe groove; a first-conductivity type active layer formed on the lower cladding layer, the active layer being bent along the U-shaped stripe groove, the refractive index of the active layer being larger than that of the cladding layer, and the forbidden band width of a center portion, except in the neighborhood of resonator mirrors, of the active layer being smaller than that of the lower cladding layer; a second-conductivity type upper cladding layer formed on the bent active layer, the upper cladding layer being bent along the U-shaped stripe groove, the refractive index of the upper cladding layer being smaller than that of the active layer, and the forbidden band width of the upper cladding layer being larger than that of at least the center portion of the active layer; a first-conductivity type current blocking layer formed on the bent upper cladding layer, the current blocking layer provided with a rectangular groove at a center portion thereof except in the neighorhood of the resonator mirrors so that a part of the upper cladding layer is exposed at the bottom of the rectangular groove; and a second-conductivity type contact layer formed on the current blocking layer and the upper cladding layer is exposed at the bottom of the rectangular groove.

The invention also includes method for fabricating a semiconductor laser device comprises the steps of: forming a U-shaped stripe groove on an upper surface of a first-conductivity type semiconductor crystal substrate in a resonator direction; forming a first-conductivity type lower cladding layer on the substrate, which is bent along the groove; forming a first-conductivity type active layer on the lower cladding layer, which is bent along the groove provided the refractive index of the active layer is larger than that of the lower cladding layer; forming a second-conductivity type upper cladding layer of the active layer, which is bent along the groove, provided the refractive index of the upper cladding layer being is smaller than that of the active layer and forbidden band width of the upper cladding layer is larger than that of the active layer; forming a first-conductivity type current blocking layer on the upper cladding layer, which is bent along the groove; forming a rectangular groove at a center portion, except in the neighborhood of resonator mirrors, of the current blocking layer, so that a part of the upper cladding layer is exposed at the of the rectangular groove; and forming a second-conductivity type contact layer on the current blocking layer and on the upper cladding layer in the rectangular groove successively, and simultaneously diffusing impurities at a center portion, except in the neighborhood of the resonator mirrors, of the active layer to thereby make the forbidden band width of the diffusion region smaller.

The above and other objects, features and advantages of the present invention will become more apparent from the following description when taken in conjunction with the accompanying drawings in which a preferred embodiment of the present invention is shown by way of illustrative example.

DESCRIPTION OF A PREFERRED EMBODIMENT

Figure 1A:
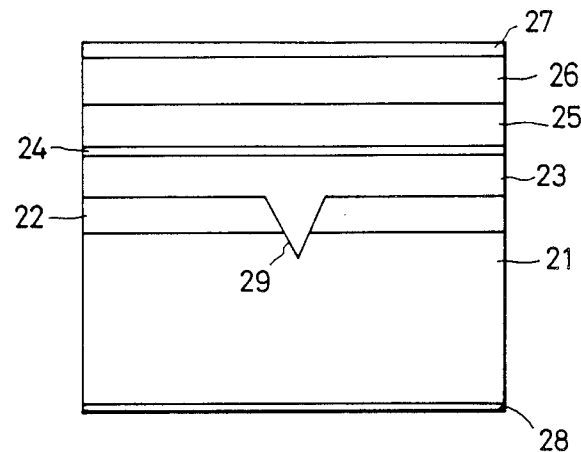
FIGS. 1(a) and 1(b) are schematic diagrams showing a conventional semiconductor laser device, FIG. 1(a) showing a cross-section of the laser device and Fig. 1 (b) also showing a cross-section which is obtained by taking along a line b-b' in FIG. 1(a)
Figure 1B:
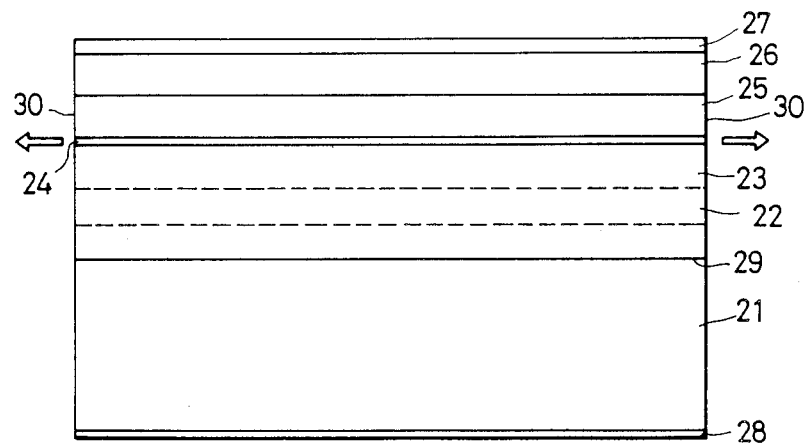
Figure 2A:
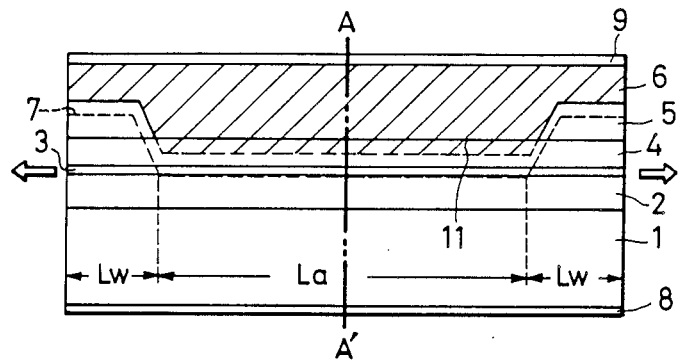
FIGS. 2(a) to 2(d) are explanatory diagrams for a description of a semiconductor laser device according to the present invention, FIG. 2(a) showing a cross-section of a semiconductor laser device according to the present invention in a longitudinal resonator direction, FIGS. 2(b) and 2(c) showing structures of both resonator end facets of the laser device shown in FIG. 2(a), respectively, and FIG. 2(d) showing a cross-section of the laser device, which is obtained by taking along a line A-A' in FIG. 2(a).
Figure 2B:
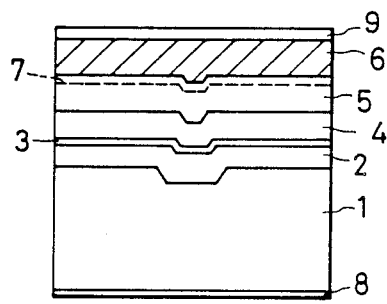
Figure 2C:
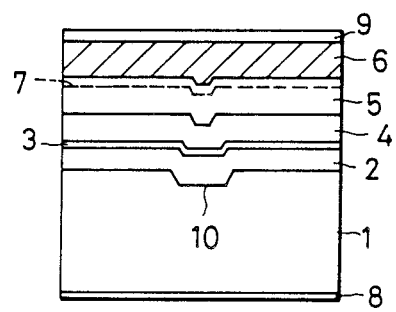
Figure 2D:
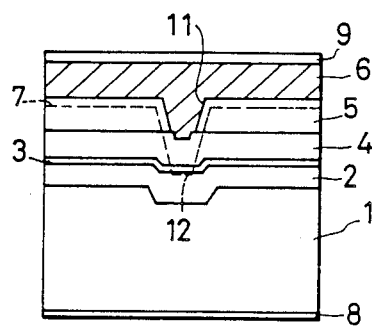

FIGS. 2(a) to 2(d) are explanatory diagrams for a description of a semiconductor laser device according to the present invention. FIG. 2(a) shows a cross-section of the semiconductor laser device in a longitudinal resonator direction. FIGS. 2(b) and 2(c) show structures of both resonator end facets of the laser device shown in FIG. 2(a), respectively. Further, FIG. 2(d) shows a cross-section of the laser device, which is obtained by taking along a line d-d' in FIG. 2(a).

In FIGS. 2(a) to 2(d), reference numeral 1 designates an n-GaAs crystal substrate; 2, an n-Al$_y$Ga$_{1-y}$As lower cladding layer; 3, an n-Al$_x$Ga$_{1-x}$As active layer; 4, a p-Al$_y$Ga$_{1-y}$As upper cladding layer; 5, an n-GaAs current blocking layer; 6, a p-GaAs contact layer; 7, a diffusion region; 8 and 9, n-side and p-side electrodes; 10, a U-shaped stripe groove; 11, a rectangular groove; and 12, an active region (y>x).

A fabrication process for the semiconductor laser device shown in FIGS. 2(a) to 2(d) will be described hereinafter.

First, the U-shaped stripe groove 10 having a 3 to 5 μm width and a 1 to 3 μm depth for instance is formed along a direction perpendicular to the resonator end facets by a well-known photo-plate-making technique and etching technique for the crystal substrate 1. Then, the lower cladding layer 2, the active layer 3, the upper cladding layer 4 and the current blocking layer 5 are grown, in the stated order, on the substrate 1 having the groove 10 by using metalorganic chemical vapor deposition (MO-CVD). In this case, the above-described layers bend along the grooved substrate 1 as shown in FIGS. 2(b) to 2(d) due to the MO-CVD. After the growth of the above-described layer the current blocking layer 5 is subjected to the well-known photo-plate-making and etching procedures to form the rectangular groove 11 as shown in FIG. 2(a). As is clear from FIG. 2(a), the rectangular groove 11 is provided restrictively to a center portion of the current blocking layer 5. In other words, the rectangular groove 11 is not exposed to either of the both resonator end facets. Further, the rectangular groove 11 is positioned just above the U-shaped stripe groove 10 formed into the crystal substrate 1 and the depth of the groove 11 is determined so that the bottom of the groove 11 is exposed to the upper cladding layer 4 as shown in FIG. 2(d). Furthermore, the longitudinal direction of the groove 11 is aligned to a direction perpendicular to the both resonator end facets. Thereafter, the contact layer 6 is formed on the current blocking layer 5. At the same time, selective diffusion of impurities is carried out through the rectangular groove 11 with using the current blocking layer 5 as a mask, to thereby form the diffusion region 7. Because the diffusion speed in the cladding layer 4 is higher than that in the current blocking layer 5 and the groove 11 is provided restrictively to the center portion of the current blocking layer 5, the deep diffusion region 7 can be formed at the center portion of the laser device as shown in FIG. 2(d).

More concretely, the above-described diffusion operation is made possible with ease by carrying out the growth of the contact layer 6 through a liquid phase epitaxial method and controlling the infiltration amount of the impurities to the layers, temperature and time. As a result of the growth of the layer 6, it is possible to repair concaved portions caused by the provision of the groove 10 and to bury the rectangular groove 11. In addition, the resultant upper surface of the layer 6 can be made smooth and flat.

In order to make the above-described semiconductor laser device operative, a forward bias voltage is applied across the n-side electrode 8 and the p-side electrode 9 to thereby make a forward direction current flow across the PN junction and concentrate the current to the active layer 3. The current path is limited to the vicinity of the rectangular groove 11 by the current blocking layer 5, and thus the current is concentrated to the active region 12 (the flat bended portion of the active layer 3). Upon the injection of carriers, the recombination of the electrons and holes causes the active layer 12 to emit a lasing beam. As the current increases, the beam is reflected and amplified in the resonator. Then, when the current exceeds a threshold level, an oscillation occurs.

Since the active layer 3 is grown on the stripe-grooved crystal substrate 1 by the MO-CVD method, the active layer 3 bends along the surface of the crystal substrate 1. Therefore, the position or the width (of the flat portion corresponding to the bottom of the groove) can be controlled by controlling the width and depth of the stripe groove 10 and the thickness of the lower cladding layer 2. The bent active layer 3 has relatively high refractive index at the flat portion thereof whereas it has lower refractive index at the both sides of the flat portion. Consequently, this results in a guide structure having a difference in refractive index in the transverse direction. In addition to this fact, it becomes possible to confine the carriers and light in the active layer 12 effectively by the function of the upper and lower cladding layers 2 and 4 each having a large forbidden band width (being low in refractive index) which are positioned closely thereto.

Furthermore, as shown in FIGS. 2(a) to 2(d), a window structure is applied to the laser device by forming the diffusion region 7 so that the forbidden band width of the active layer 3 (Lw), which is in the neighborhood of the resonator end facets, is made larger than that of the length (La) of the active layer 3 in the resonator, whereby the light absorption at the resonator end facets is reduced resulting in improving the maximum power density of the present laser device by one order of magnitude or more, which may cause the above described COD to occur.

In summary, according to the present invention, due to the provision of built-in refractive index guide structure, current confinement, structure and window structure, it is possible to provide a laser device having a low threshold current level and operating in the transverse mode stably regardless of output power density. Further, due to the provision of the bent active layer 3, a refractive index guide is formed in the transverse direction between the inside of the resonator and the neighborhood of the resonator end facets where windows are formed. Thus, it is possible to eliminate such a problem accompanying a conventional window-structure laser device having no such guide in that astigmatism becomes large. This structure can be obtained by extremely simple two crystal fabrication steps. In such an embodiment as shown in FIGS. 2(a) and 2(d), assuming that the width of the stripe groove 10 is set to 4 to 5 $\mu$m, the depth thereof is set to 2 $\mu$m, and the thickness of the lower cladding layer 2 is set up to 1.5 $\mu$m, the width of the active region 12 is about 2 to 3 $\mu$m. In this case, it is possible to obtain preferred characteristics as mentioned above with the active layer 3 being about 0.1 $\mu$m in thickness.

While the current blocking layer 5 is formed by a GaAs layer in the above described embodiment, modification of this blocking layer is possible. That is, an $Al_zGa_{1-z}As$ layer may be used instead of the GaAs layer. In case of $x<z$ and $z<y$, loss which is caused by the light absorption in the current blocking layer 5 can be reduced to thereby make the thickness of the upper cladding layer 4 thinner. As a result, this is advantageous in that the width and depth of the diffusion to the active region 12 can be controlled with high accuracy.

Further, it is considered that an $Al_fGa_{1-f}As$ light guide layer whose mole ratio of Al and As is between those of the active layer 3 and, either upper or lower cladding layer ($x<f<y$) may be provided between the active layer and the cladding layer, so that light is allowed to expand from the active layer 3 to the light guide layer resulting in decreasing the light density in the active layer 3 and realizing a high output power device. This structure is a so-called large resonator cavity structure.

Furthermore, in the above described embodiment Zinc is an example of one of many impurities to be diffused in Zn. However, p-type impurities such as Si and Mg may be available.

Moreover, while liquid phase epitaxy (LPE) is employed to achieve the growth of the contact layer 6, the other method such as metalorganic chemical vapour deposition (MO-CVD) and molecular beam opitaxy (MBE) may be employed.

Finally, although the above-described semiconductor laser device is made of AlGaAs/GaAs type materials, modifications are possible without departing from the concept and the scope of the present invention. For example, InGaAs type, AlGaInP type materials may be employed instead of AeGaAs/GaAs materials.

As is apparent from the above, according to the present invention, such a guide structure is provided to a semiconductor laser device in addition to a window structure that the refractive index at a flat portion of an active layer which corresponds to the bottom of a groove formed on a crystal substrate, is higher than that at the remaining portion of the active layer, and therefore both carriers and light are effectively confined to the flat portion of the active layer. As a result, it is possible to provide a high power semiconductor laser device capable of having a low threshold current level and operating stably in a fundamental transverse mode.

Further, according to the present invention, the above-described semiconductor laser device can be manufactured by a simple fabricating method including simple crystal growth processes. Further, the semiconductor laser device is readily fabricated in significant quantities.

What is claimed is:

1. A method for fabricating a semiconductor laser device comprising the steps of:

forming a U-shaped stripe groove on an upper surface of a first-conductivity type semiconductor crystal substrate in a resonator direction;

forming a first-conductivity type lower cladding layer on said substrate, which is bent along said groove;

forming a first-conductivity type active layer on said lower cladding layer, which is bent along said groove, refractive index of said active layer being larger than that of said lower cladding layer;

forming a second-conductivity type upper cladding layer on said active layer, which is bent along said groove, refractive index of said upper cladding layer being smaller than that of said active layer and forbidden band width of said upper cladding layer being larger than that of said active layer;

forming a first-conductivity type current blocking layer on said upper cladding layer, which is bent along said groove;

forming a rectangular groove at a center portion, except neighborhood of resonator mirrors, of said current blocking layer, so that a part of said upper cladding layer is exposed at a bottom of said rectangular groove; and forming a second-conductivity type contact layer on said current blocking layer and on said upper cladding layer in said rectangular groove successively, and simultaneously diffusing impurities at a center portion, except neighborhood of the resonator mirrors, of said active layer to thereby make forbidden band width of the diffusion region smaller.

* * * * *